(12) United States Patent
Kojima

(10) Patent No.: US 7,326,861 B2
(45) Date of Patent: Feb. 5, 2008

(54) SHIELDING COVER HAVING COOLING FIN AND OPTICAL SCANNING DEVICE

(75) Inventor: Takahiro Kojima, Shizuoka-ken (JP)

(73) Assignees: Kabushiki Kaisha Toshiba, Tokyo (JP); Toshiba Tec Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/037,228

(22) Filed: Jan. 19, 2005

(65) Prior Publication Data

US 2006/0185871 A1  Aug. 24, 2006

(51) Int. Cl.
*G01N 21/17* (2006.01)
(52) U.S. Cl. .................. 174/350; 174/356; 174/369; 174/355; 174/383
(58) Field of Classification Search .............. 174/35 R, 174/17 VA, 350, 356, 369, 355, 383; 361/697, 361/703
See application file for complete search history.

(56) References Cited

U.S. PATENT DOCUMENTS 5,343,296 A * 8/1994 Hellstrom .................. 356/431
2004/0174678 A1 9/2004 Kojima

FOREIGN PATENT DOCUMENTS

JP  11-160644 A  6/1999

* cited by examiner

*Primary Examiner*—Jinhee Lee
(74) *Attorney, Agent, or Firm*—Foley & Lardner LLP

(57) ABSTRACT

The present invention insulates the source of noise efficiently by forming a thick noise insulating portion to the cover to tightly seal a drive unit which generates heat and noise and at the same time, increases the cooling effect of cooling fins by making the surface areas of the cooling fin ends that are away from the noise insulating portion wide by the amount equivalent to the surface area of the cooling fins decreased by the noise insulating portion provided, and obtains the shielding cover that is excellent in both cooling and noise insulation.

14 Claims, 3 Drawing Sheets

SHIELDING COVER HAVING COOLING FIN AND OPTICAL SCANNING DEVICE

BACKGROUND OF THE INVENTION

1. Field of the Invention

The present invention relates to a shielding cover provided with cooling fins to cool down heat generated from a drive unit such as a motor in various apparatuses.

2. Description of the Related Art

In various apparatus which are incorporating a drive unit such as a motor, etc. for driving operating devices, when a driving unit is operated, for example, a motor bearing is heated causing temperature rise and also noise is generated from the rotating motor. In particular, in the case of a drive motor which drives an operating unit that is rotated and driven at a high speed such as a polygon mirror to reflect and polarize optical beam emitted from a laser beam emitting element in the direction of a photo conductor for forming electrostatic latent images, the heat is generated from a bearing when a motor is driven and furthermore, the generating noise becomes large. Such the temperature rise resulting from the rotation of a drive motor gives an adverse effect to electronic parts around the motor and may damage them.

In the Japanese Patent Application Publication No. 11-160644, an optical beam scanner with special shaped cooling fins provided on a polygon mirror housing is disclosed. This conventional optical beam scanner is provided with sealing members on the peripheral wall of the housing with cooling fins in a special shape projecting from the bottom surface of the housing around the bearing unit of the polygon mirror member. Thus, the conventional optical beam scanner promotes the cooling effect by the cooling fins and prevents leakage of noises by the sealing member.

However, this conventional optical beam scanner promotes the cooling effect by increasing the cooling area of the cooling fins but the cooling fins are formed in the special shape and the flow of air passing through the cooling fins is not taken into consideration. Further, although the leakage of noise is prevented totally, the noise insulation against those portions especially generating intense noises is not considered.

So, a shielding cover and an optical scanner provided with cooling fins, which increase reliability by preventing damage of surrounding parts and also are excellent in sound-proofing are so far demanded.

SUMMARY OF THE INVENTION

An object of the present invention is to provide a shielding cover and an optical scanner with cooling fins provided to prevent damage of surrounding parts by effectively cooling heat generated from a drive unit when it is driven and has a high reliability by effectively insulating noise generated from the drive unit.

According to the embodiment of the present invention, the shielding cover provided with cooling fins is characterized in that it has a housing means to support a driving means, a covering means to tightly seal the driving means in the housing, a noise insulating means provided to the covering means at the portion near a noise source of the driving means and plural flat plate shape cooling fins arranged in parallel on the surface of the covering means, and the noise insulating means is formed by making the covering means thick and the cooling fins are so formed as to make the surface area of the portion away from the noise source of the driving means wider than the portion near the noise insulating means.

DETAILED DESCRIPTION OF THE EMBODIMENTS

Figure 1:
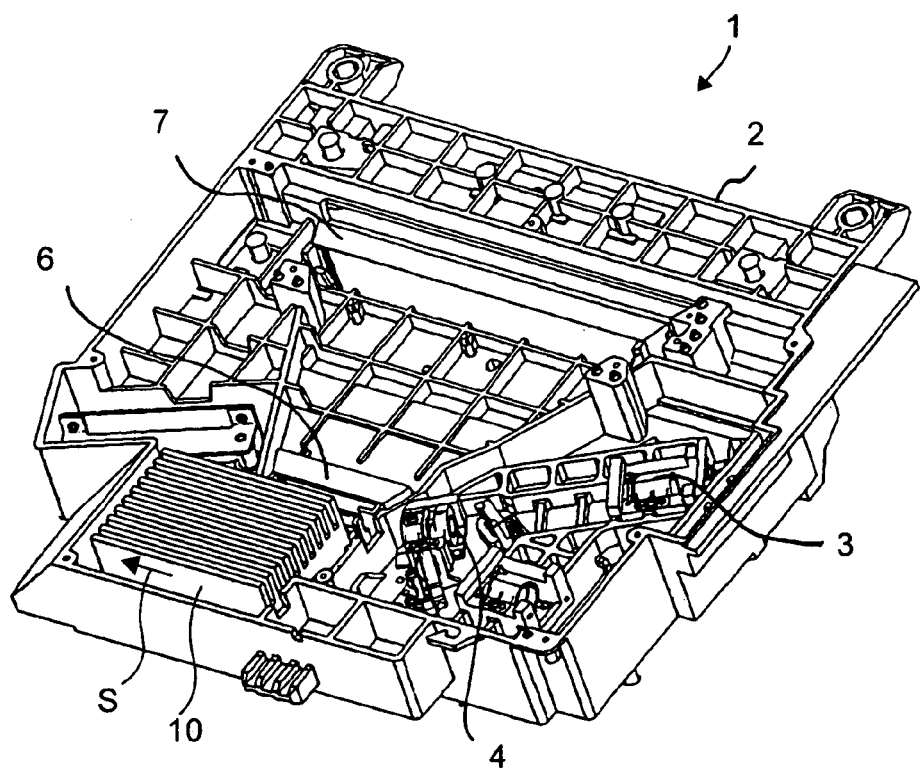
FIG. 1 is a schematic perspective view showing a laser exposing unit incorporated with the optical scanner in the embodiments of the present invention.
Figure 2:
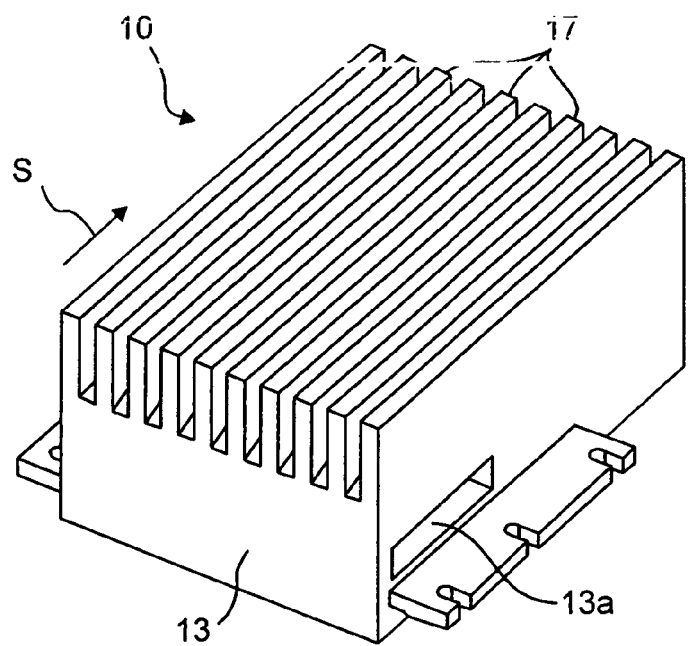
FIG. 2 is a schematic perspective view showing the external appearance of the optical scanner in the embodiments of the present invention.
Figure 3:
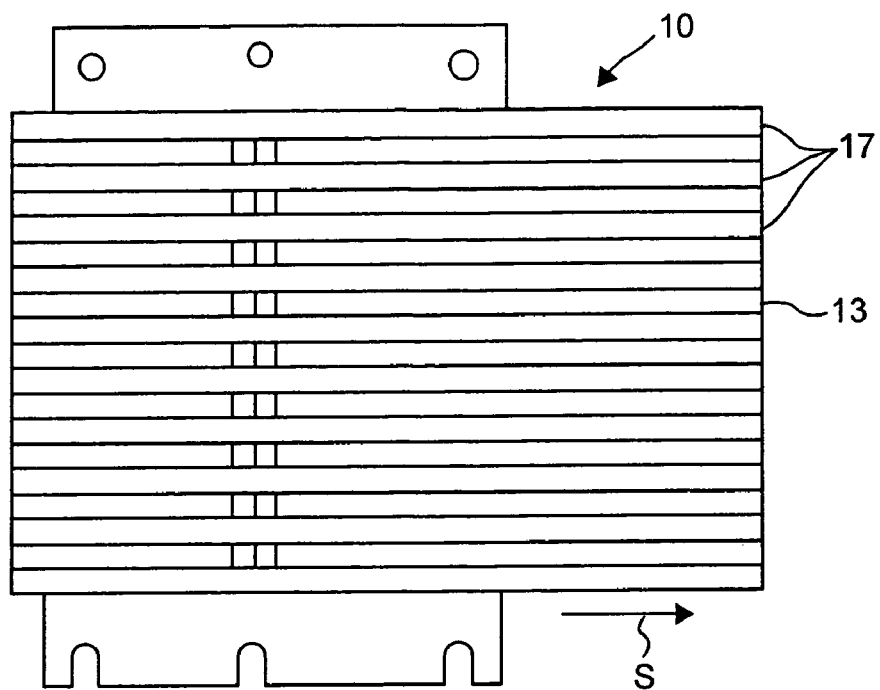
FIG. 3 is a schematic top view showing the optical scanner in the embodiments of the present invention.

Preferred embodiments of the present invention will be described below in detail referring to the attached drawings. FIG. 1 shows a laser exposure unit 1 to irradiate laser beam to a photo conductor of an electro-photographic image forming apparatus (not shown). Laser exposure unit 1 incorporates an optical scanner 10 that is an embodiment of this invention in a casing 2. Laser exposure unit 1 emits laser beam to optical scanner 10 by a semiconductor laser element 3 and a pre-polarizing optical system 4. Laser exposure unit 1 further reflects and polarizes the laser beam emitted in optical scanner 10 and focus an image on a photo conductor (not shown) by focusing optical systems 6, 7.

Optical scanner 10 in casing 2 supports a polygon mirror 12 that is a driving means by a housing 11 that is a housing means. Further, optical scanner 10 is tightly sealing polygon mirror 12 in housing 11 by a cover unit 13 that is a covering means having cooling fins 17. Further, optical scanner 10 has an electric part 14 such as a capacitor, etc. installed in housing 11. Housing 11 and cover unit 13 comprise a shielding cover 18 to tightly seal polygon mirror 12 and is formed with a metal such as aluminum, etc. or polycarbonate + ABS resin (a copolymer of acrylonitrile, butadiene and styrene), etc. Further, a sealing member 19 is provided between housing 11 and cover unit 13 for sound insulation.

Polygon mirror 12 is in one united body with a polygon motor 16 and is rotated at a high speed of 60,000 rpm and reflecting and polarizing laser beam irradiated from semiconductor laser element 3 and emits the laser beam through a window 13a of cover unit 13. As polygon mirror 12 is rotated at a high speed in this way, when polygon motor 16 is rotated, its bearing 16a is heated and becomes a source of generating noise.

Figure 4:
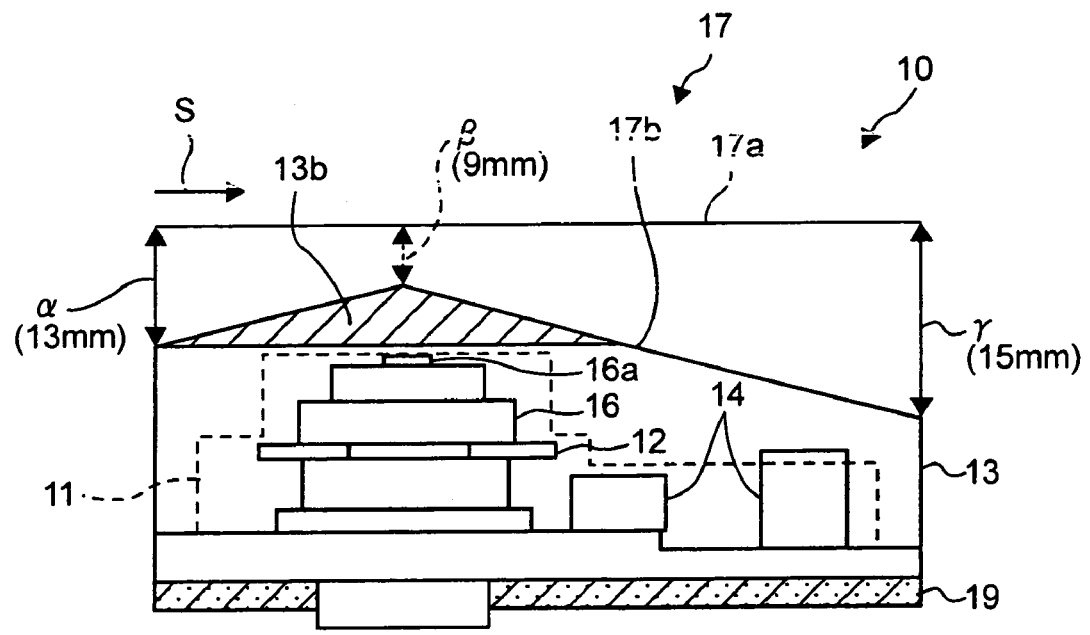
FIG. 4 is a schematic construction diagram showing the optical scanner in the embodiments of the present invention.

On the other hand, plural cooling fins in flat plate shape arranged in a straight line are formed in one united body on the surface of cover unit 13. Upper ends 17a of cooling fins 17 are formed linearly as shown in FIG. 4. Roots 17b of cooling fins 17 are formed almost in a conical shape with the upper portion near bearing 16a made as the top. That is, the air current take-in side α of cooling fins 17 is wide along the arrow direction s and is narrowed at the top angle portion β in the conical shape above bearing 16a of polygon motor 16 and again becomes wider toward the air current exhausting side end γ. Thus, the surface areas of cooling fins 17 are formed wide at the air current take-in side end portion α from the noise source and the air current exhausting side end γ is narrowed at the upper portion β of bearing 16a of polygon motor 16 near the noise source. Further, as shown by the hatched section in FIG. 4, in the area covering the upper portion of bearing 16a of polygon motor 16 at the root portions 17b, a noise insulating portion 13b of thick cover unit 13 is formed. Noise leaking from a noise source of polygon motor 17 is locally insulated by this noise insulating portion 13b.

In optical scanner 10 formed in such the structure, polygon motor 16 and polygon mirror 12 that is in one united body with the motor are rotated to scan the laser beam from semiconductor laser element 3 of laser exposure unit 1 on a photo conductor. The heat generated on bearing 16a of polygon moor 16 at this time is radiated efficiently through cooling fins 17 of cover unit 13. That is, the air current in the arrow direction s is generated in the vicinity of optical scanner 10 by a fan, etc. (not shown) for exhausting and pass through plural cooling fins 17. Noise insulating portion 13b is formed on the upper portion β of bearing 16a of polygon motor 16, which is a source of noise and the surface area of cooling fins 17 is narrowed but the surface area of the air current take-in side end α and the air current exhausting side end γ is formed wide so as to get high cooling efficiency. Accordingly, cover unit 13 effective insulates noise generated locally in bearing 16a of polygon motor 16 by noise insulating unit 13b and heat generated in bearing 16a of polygon motor 16 is radiated quickly by cooling fins 17.

Figure 5:
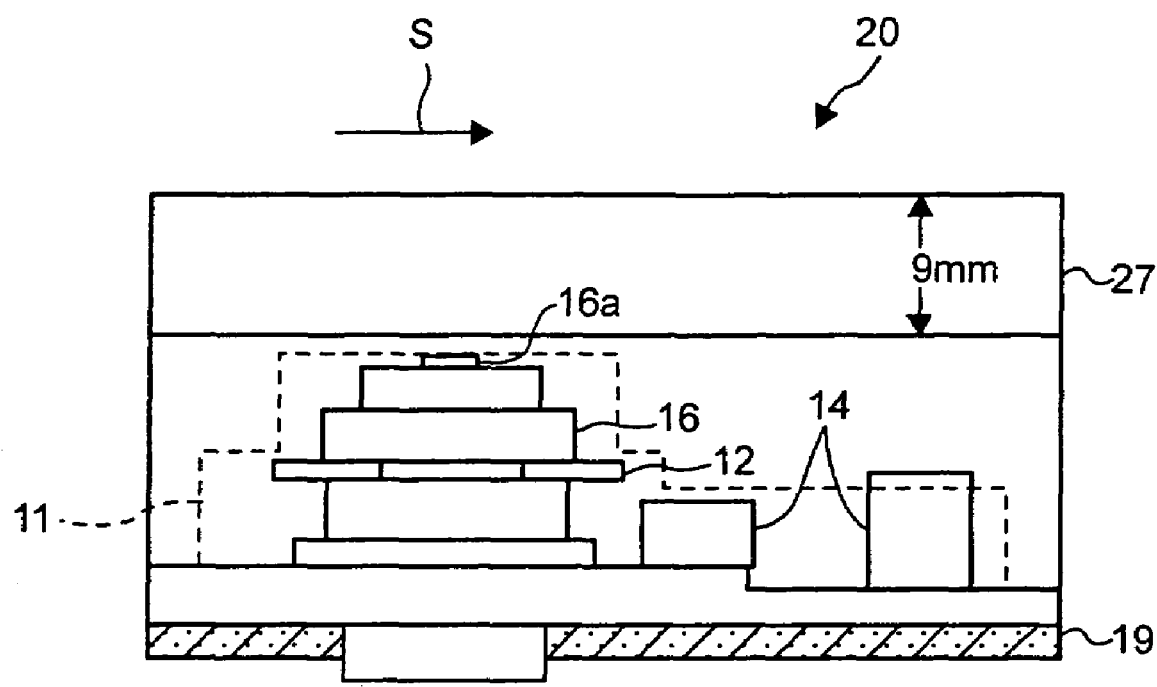
FIG. 5 is a schematic construction diagram showing a optical scanner in a comparison example.

By installing optical scanner 10 in this embodiment of this laser exposure unit 1, its cooling effect and noise insulating effect were compared with conventional equipment. First, as a comparative example, the measurements of cooling effect and noise insulating effect of a conventional optical scanner 20 shown in FIG. 5 were conducted. As a cover unit 23 to tightly seal polygon mirror 12 together with housing 11 flat plate shape cooling fins 27 in 3 mm uniformly thick and 9 mm high formed in one united body with cover unit 23 was used for optical scanner 23. When polygon mirror 12 was rotated for 60 min. at 60,000 rpm at a room temperature 23° C., the temperature of housing 11 was about 80° C. and noise around optical scanner 20 was about 670 dB.

On the contrary, in this embodiment, cover unit 13 was 5 mm thick and the maximum thickness of noise insulating unit 13b was made 9 mm. Further, the height of the take-in side end a of cooling fins 17 was made 13 mm and the height of the top β of the chevron was made 9 mm and the height of the air current exhausting side end γ was made 15 mm. With optical scanner 10 installed in laser exposure unit 1, the measurements of cooling effect and noise insulating effect were conducted. As a result, when polygon mirror 12 was rotated for 60 min. at 60,000 rpm under a room temperature 23° C., the temperature of housing 11 was about 50° C. and improved by 30° C. when compared with the comparative example. Further, noise around optical scanner 10 is improved by 15 dB when compared with 45 dB in the comparative example.

According to this embodiment, thick noise insulating unit 13b was formed on cover unit 13 and the surface area of cooling fins 17 was made wide at the air current take-in side end α and air current exhausting side end γ by the amount equal to the partially decreased surface area of cooling fins 17 for the presence of noise insulating unit 13b. Accordingly, irrespective of the high speed rotation of polygon mirror 12, the heat generated in polygon motor 16 can be cooled down efficiently and the adverse effect to other electronic components, etc. can be prevented by suppressing the temperature rise of housing 11. At the same time, it becomes possible to locally insulate the noise source of polygon motor 16 by noise insulating unit 13b and improve the noise insulating effect.

Further, the present invention is not restricted to the embodiments described above but can be modified variously within the scope thereof and for example, thickness of noise insulating unit or size to cover a noise source, etc. are not restricted within the scope to generate efficiency for noise insulation. Further, cooling fins are sufficient if capable of efficiently cooling down the optical scanner and can be formed in wide surface area of that portion away from a noise source and its space, etc. are not limited. Further, the number of revolutions, etc. of polygon mirror in the optical scanner is optional. Further, a drive unit tightly sealed by the shielding cover is not restricted to a polygon mirror but can be, for example, a main motor of an image forming apparatus if it generates heat or requires noise insulation. Further, according to a purpose of use of an apparatus, either a housing or a cover unit which tightly seals a driving unit can be set above the another unit and for example, the upper side of the driving unit may be supported by a housing and the driving unit can be tightly sealed with a cover unit from its lower side and cooling fins can be provided on the lower side of the driving unit.

As described above in detailed, according to the present invention, it is possible to insulate a source of noise by providing a noise insulation unit to the cover unit. Further, by providing a noise insulation unit, it becomes possible to cool down the heat generated from a drive unit efficiently and protect component parts from being damaged by the temperature rise when a drive unit is operated by making the surface area of the cooling fins in other regions wider than the noise insulation unit although the cooling fin area is partially narrowed by the noise insulation unit provided.

What is claimed is:

1. A shielding cover having cooling fins comprising:
   housing means for supporting a driving means;
   covering means for tightly sealing the driving means in the housing means;
   noise insulating means, provided to the covering means at a portion near a noise source of the driving means, for insulating noise generated from the noise source; and
   cooling means for cooling the driving means, the cooling means including plural flat plate shape fins arranged in parallel on the surface of the covering means,
   wherein the noise insulating means is formed by making the covering means thick, and the fins of the cooling means are formed by making the surface area of the portion of the driving means away from the noise source wider than the portion near the noise insulating means, and
   wherein an air current flow path at air current take-in ends and air current exhausting ends of the plural cooling fins is formed wider than the air current flow path near the noise source such that the cooling fins have a greater width in a direction above the surface of the covering means at the air current take-in ends and air current exhausting ends than near the noise source.

2. The shielding cover having cooling fins as claimed in claim 1, wherein an air current flowing around the housing passes through the plural cooling fins.

3. The shielding cover having cooling fins as claimed in claim 1, wherein the driving means is a drive motor to drive optical beam changing means to change the light beam by rotating and driving.

4. A shielding cover having cooling fins comprising:
a housing to support a polygon motor;
a cover unit to tightly seal the polygon motor in the housing;
a noise insulating unit provided to the cover unit at a portion near a noise source of the polygon motor; and
plural flat shape cooling fins arranged in parallel on the surface of the cover unit,
wherein the noise insulating unit is formed by making the cover unit thick and the cooling fins are formed so as to make the surface area of the portion away from the noise source of the polygon mirror wider than the portion near the noise insulating unit, and
wherein an air current flow path at air current take-in ends and air current exhausting ends of the plural cooling fins is formed wider than the air current flow path near the source of noise such that the cooling fins have a greater width in a direction above the surface of the cover unit at the air current take-in ends and air current exhausting ends than near the noise source.

5. The shielding cover having cooling fins as claimed in claim 4, wherein an air current flowing around the housing passes through the plural cooling fins.

6. A shielding cover having cooling fins comprising:
housing means for supporting a driving means;
covering means for tightly sealing the driving means in the housing means;
noise insulating means, provided to the covering means at a portion near a noise source of the driving means, for insulating noise generated from the noise source; and
cooling means for cooling the driving means, the cooling means including plural flat plate shape fins arranged in parallel on the surface of the covering means,
wherein an air current flow path at air current take-in ends and air current exhausting ends of the plural cooling fins is formed wider than the air current flow path near the noise source such that the cooling fins have a greater width in a direction above the surface of the covering means at the air current take-in ends and air current exhausting ends than near the noise source.

7. The shielding cover having cooling fins as claimed in claim 6, wherein an air current flowing around the housing passes through the plural cooling fins.

8. The shielding cover having cooling fins as claimed in claim 6, wherein the driving means is a drive motor to drive optical beam changing means to change the light beam by rotating and driving.

9. A shielding cover having cooling fins comprising:
a housing to support a polygon motor;
a cover unit to tightly seal the polygon motor in the housing;
a noise insulating unit provided to the cover unit at a portion near a noise source of the polygon motor; and
plural flat shape cooling fins arranged in parallel on the surface of the cover unit,
wherein an air current flow path at air current take-in ends and air current exhausting ends of the plural cooling fins is formed wider than the air current flow path near the noise source such that the cooling fins have a greater width in a direction above the surface of the cover unit at the air current take-in ends and air current exhausting ends than near the noise source.

10. The shielding cover having cooling fins as claimed in claim 9, wherein an air current flowing around the housing passes through the plural cooling fins.

11. A shielding cover having cooling fins, comprising:
housing means for supporting a driving means;
covering means for tightly sealing the driving means in the housing means;
noise insulating means, provided to the covering means at a portion near a noise source of the driving means, for insulating noise generated from the noise source; and
cooling means for cooling the driving means, the cooling means including plural flat plate shape fins arranged in parallel on the surface of the covering means,
wherein the noise insulating means is formed by making the covering means thick, and the fins of the cooling means are formed by making the surface area of the portion of the driving means away from the noise source wider than the portion near the noise insulating means, and upper ends of the plural cooling fins are formed in a straight line shape and roots of the cooling fins are formed in a conical shape in the vertical direction to the parallel direction of the flat plate shape fins with the portion near the noise source, wherein an air current flow path at air current take-in ends and air current exhausting ends of the plural cooling fins is formed wider than the air current flow path near the noise source such that the cooling fins have a greater width in a direction above the surface of the covering means at the air current.

12. A shielding cover having cooling fins, comprising:
a housing to support a polygon motor;
a cover unit to tightly seal the polygon motor in the housing;
a noise insulating unit provided to the cover unit at a portion near a noise source of the polygon motor; and
plural flat shape cooling fins arranged in parallel on the surface of the cover unit,
wherein the noise insulating unit is formed by making the cover unit thick and the cooling fins are formed so as to make the surface area of the portion away from the noise source of the polygon mirror wider than the portion near the noise insulating unit, and upper ends of plural cooling fins are formed in a straight line shape and roots of the cooling fins are formed in a conical shape in the vertical direction to the parallel direction of the flat shape cooling fins with the portion near the source of noise, wherein an air current flow path at air current take-in ends and air current exhausting ends of the plural cooling fins is formed wider than the air current flow path near the noise source such that the cooling fins have a greater width in a direction above the surface of the covering means at the air current.

13. A shielding cover having cooling fins, comprising:
housing means for supporting a driving means;
covering means for tightly sealing the driving means in the housing means;
noise insulating means, provided to the covering means at a portion near a noise source of the driving means, for insulating noise generated from the noise source; and
cooling means for cooling the driving means, the cooling means including plural flat plate shape fins arranged in parallel on the surface of the covering means,
wherein upper ends of the plural cooling fins are formed in a straight line shape and roots of the cooling fins are formed in a conical shape in the vertical direction to the parallel direction of the flat plate shape fins with the portion near the noise to-source, wherein an air current flow path at air current take-in ends and air current exhausting ends of the plural cooling fins is formed wider than the air current flow path near the noise source such that the cooling fins have a greater width in a direction above the surface of the covering means at the air current.

14. A shielding cover having cooling fins, comprising:

a housing to support a polygon motor;

a cover unit to tightly seal the polygon motor in the housing;

a noise insulating unit provided to the cover unit at a portion near a noise source of the polygon motor; and plural flat shape cooling fins arranged in parallel on the surface of the cover unit, wherein upper ends of the plural cooling fins are formed in a straight line shape and roots of the cooling fins are formed in a conical shape in the vertical direction to the parallel direction of the flat shape cooling fins with the portion near the source of -noise, wherein an air current flow path at air current take-in ends and air current exhausting ends of the plural cooling fins is formed wider than the air current flow path near the noise source such that the cooling fins have a greater width in a direction above the surface of the covering means at the air current.

* * * * *